(12) United States Patent
Dunckley et al.

(10) Patent No.: US 9,953,764 B2
(45) Date of Patent: Apr. 24, 2018

(54) ADHESIVELY BONDED CYLINDRICAL MAGNETS COMPRISING ANNULAR COILS, AND METHOD OF MANUFACTURE THEREOF

(71) Applicant: Siemens Plc., Camberley (GB)

(72) Inventors: Ian Dunckley, Cambridge (GB); David William Neil Edington, St Albans (GB); Edward Wedderburn Kershaw, Oxon (GB); Matthew John Longfield, Oxon (GB); Peter Neil Morgan, Cambridge (GB)

(73) Assignee: Siemens Healthcare Limited, Camberley (GB)

( * ) Notice: Subject to any disclaimer, the term of this patent is extended or adjusted under 35 U.S.C. 154(b) by 159 days.

(21) Appl. No.: 14/533,580

(22) Filed: Nov. 5, 2014

(65) Prior Publication Data

US 2015/0061801 A1    Mar. 5, 2015

Related U.S. Application Data

(62) Division of application No. 13/239,658, filed on Sep. 22, 2011, now Pat. No. 8,970,337.

(30) Foreign Application Priority Data

Sep. 22, 2010   (GB) .................................. 1015876.4

(51) Int. Cl.
   *H01F 7/20*    (2006.01)
   *H01F 41/02*   (2006.01)
   (Continued)

(52) U.S. Cl.
   CPC ......... *H01F 41/02* (2013.01); *G01R 33/3802* (2013.01); *H01F 6/06* (2013.01);
   (Continued)

(58) Field of Classification Search
   CPC . G01R 33/3802; G01R 33/3815; H01F 41/02; H01F 6/06; H01F 7/20; H01F 27/06; Y10T 29/49071; Y10T 29/4902
   See application file for complete search history.

(56) References Cited

U.S. PATENT DOCUMENTS 3,941,183 A    3/1976   Vedda et al.
4,467,303 A    8/1984   Laskaris
(Continued)

FOREIGN PATENT DOCUMENTS

| EP | 0371350 A1 | 6/1990 |
| GB | 24377114 A | 10/2007 |
| JP | S6399303 A | 4/1988 |

OTHER PUBLICATIONS

Van Der Laan et al., "Bore Superconducting Magnet Operating With Cryocoolers at 12K," IEEE Transactions on Magnetics vol. 28, No. 1, Jan. 1992, pp. 633-636.

*Primary Examiner* — Bernard Rojas
(74) *Attorney, Agent, or Firm* — Schiff Hardin LLP

(57) ABSTRACT

In a solenoid magnet assembly, and a method for manufacture thereof, the magnet assembly includes a number of concentrically aligned coils, each including a winding impregnated with a resin. Each coil is mechanically restrained so as to hold the coils in fixed relative positions relative to each other when forming the magnet assembly. The mechanical restraint can be formed by annular support sections bonded to the respective coils, lugs bonded to the respective coils, or by lugs that are at least partially embedded in a crust formed on a radially outer surface of the respective windings.

11 Claims, 18 Drawing Sheets

(51) Int. Cl.
  *G01R 33/38* (2006.01)
  *H01F 6/06* (2006.01)
  *H01F 27/06* (2006.01)
  *G01R 33/3815* (2006.01)

(52) U.S. Cl.
  CPC .............. *H01F 7/20* (2013.01); *H01F 27/06* (2013.01); *G01R 33/3815* (2013.01); *Y10T 29/4902* (2015.01); *Y10T 29/49071* (2015.01)

(56) References Cited

U.S. PATENT DOCUMENTS

| | | |
|---|---|---|
| 4,571,568 A | 2/1986 | Grangereau |
| 4,591,790 A | 5/1986 | Takahashi |
| 4,639,672 A | 1/1987 | Beaumont |
| 4,779,049 A | 10/1988 | Takahashi |
| 5,084,676 A | 1/1992 | Saho et al. |
| 5,239,276 A | 8/1993 | Roth et al. |
| 5,291,169 A | 3/1994 | Ige et al. |
| 5,917,393 A | 6/1999 | Kupiszewski et al. |
| 6,078,234 A | 6/2000 | Huang et al. |
| 6,842,005 B2 | 1/2005 | Schuster |
| 7,701,677 B2 | 4/2010 | Schultz et al. |

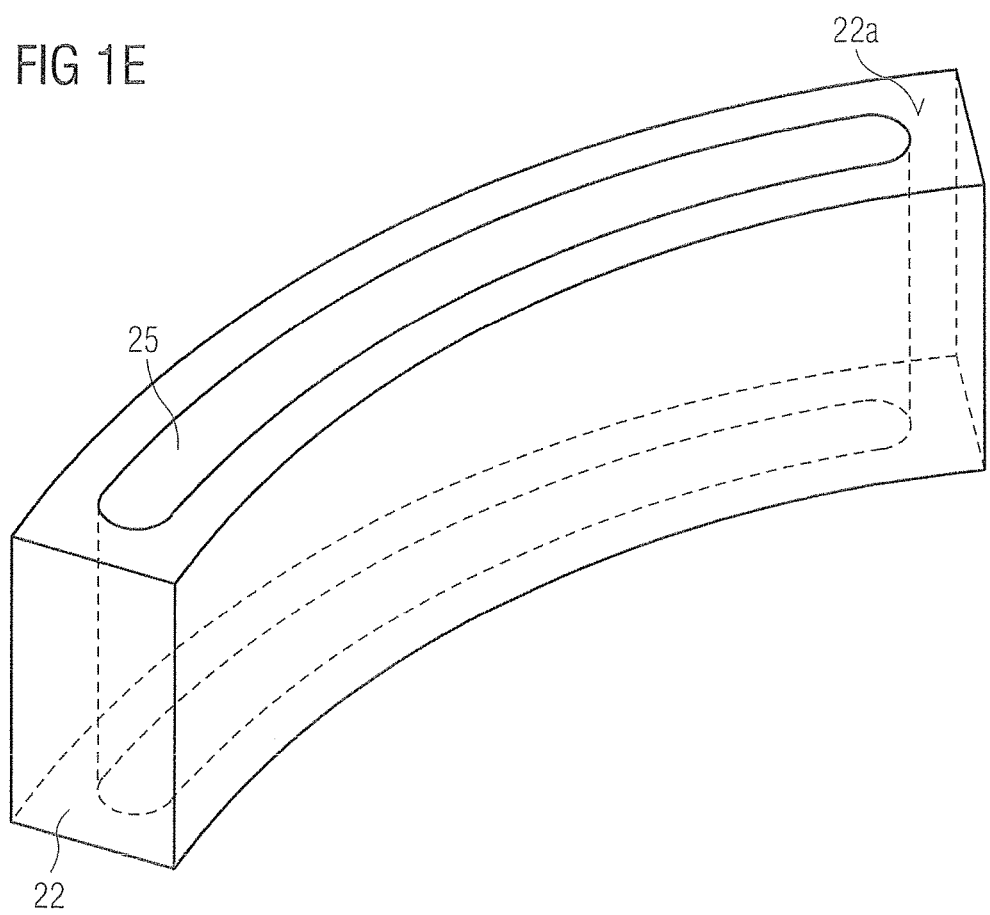

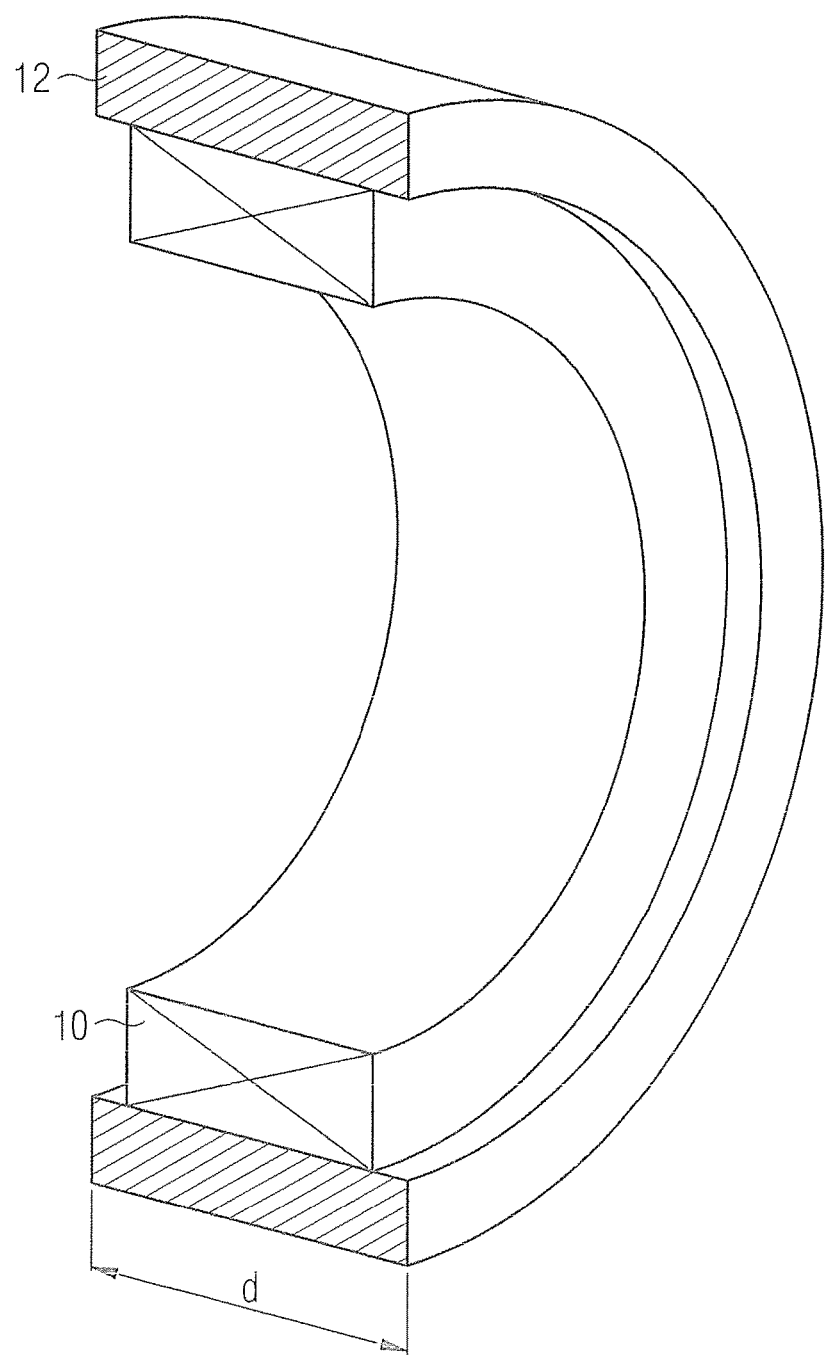

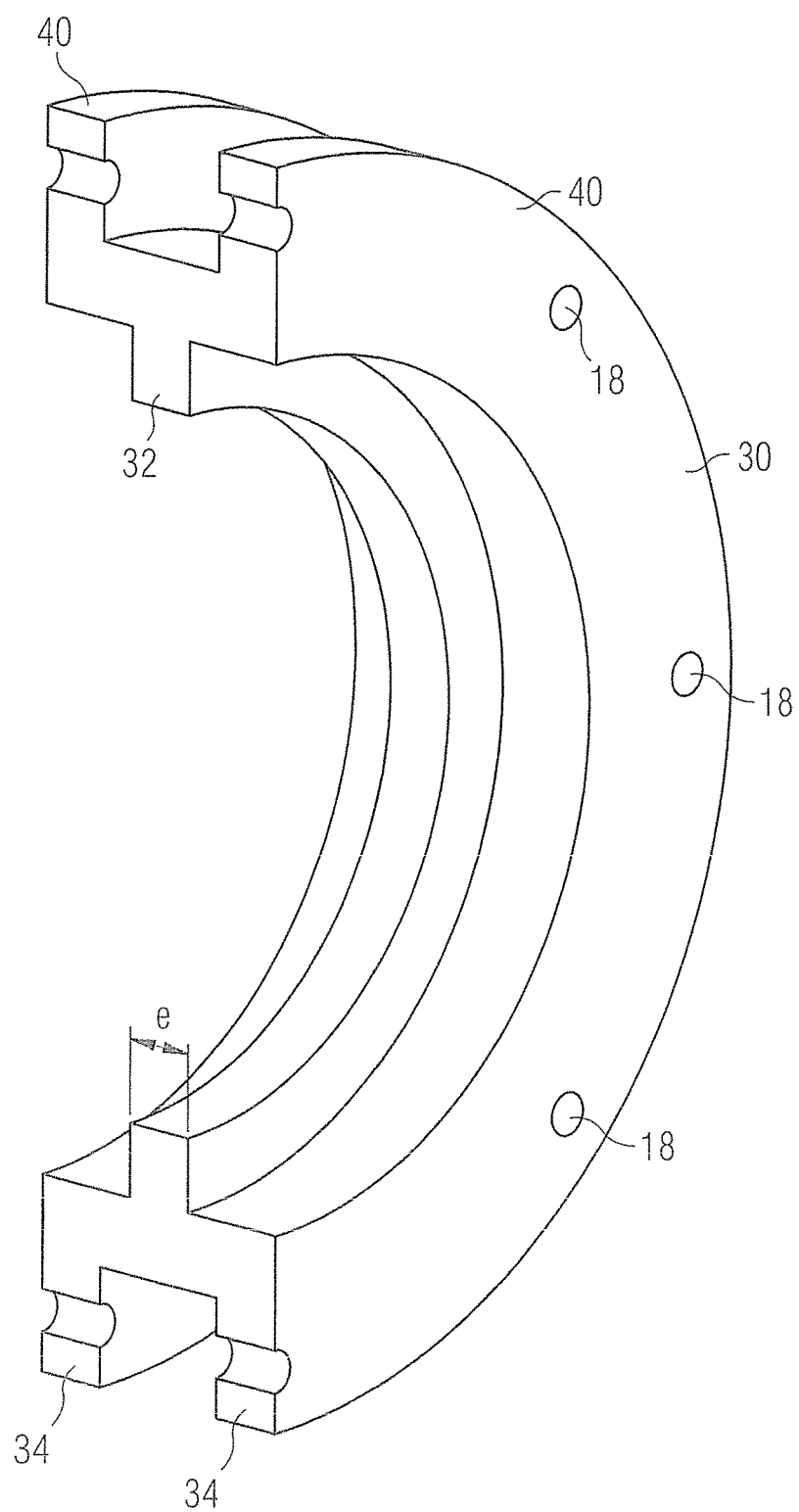

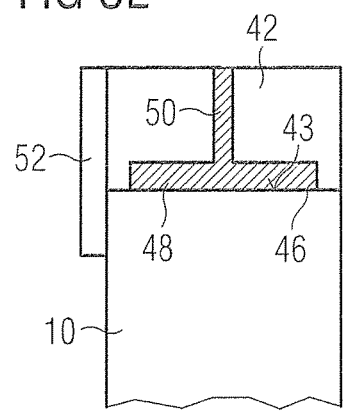
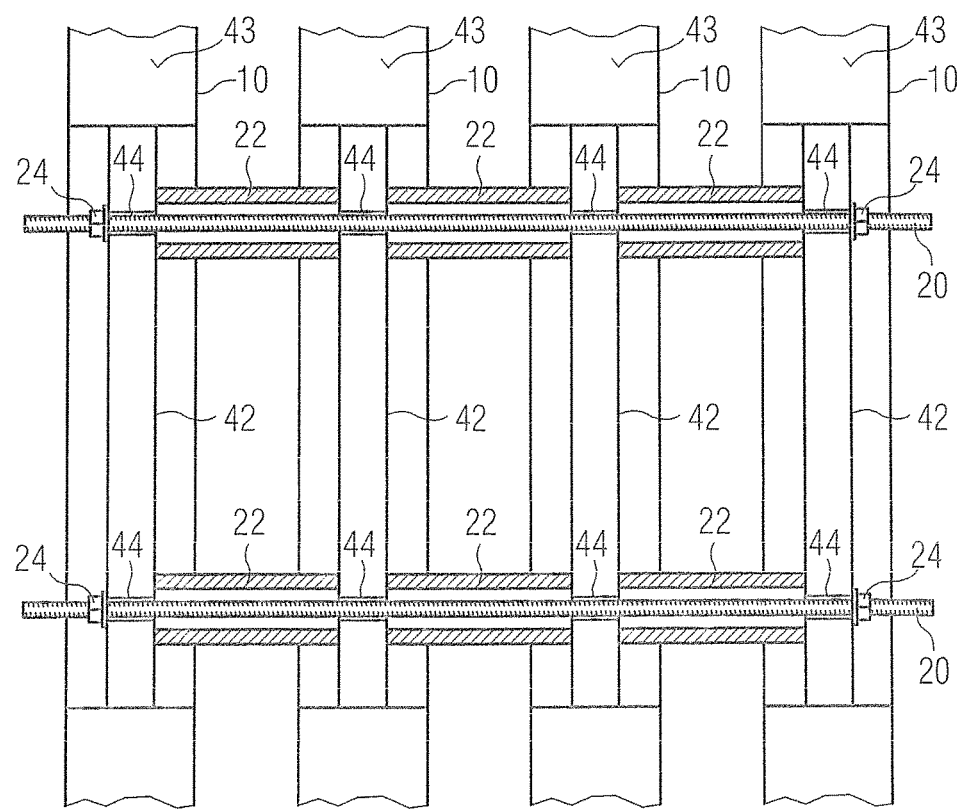

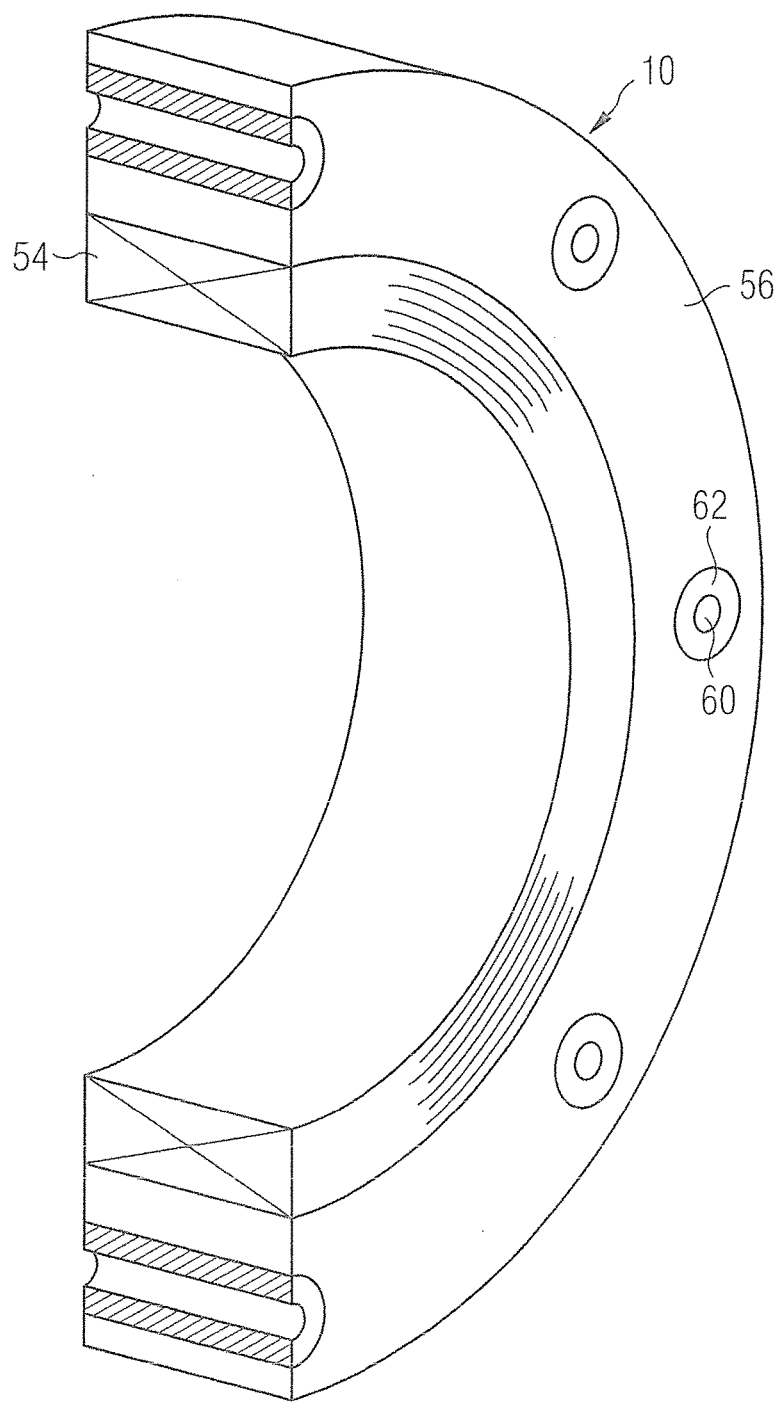

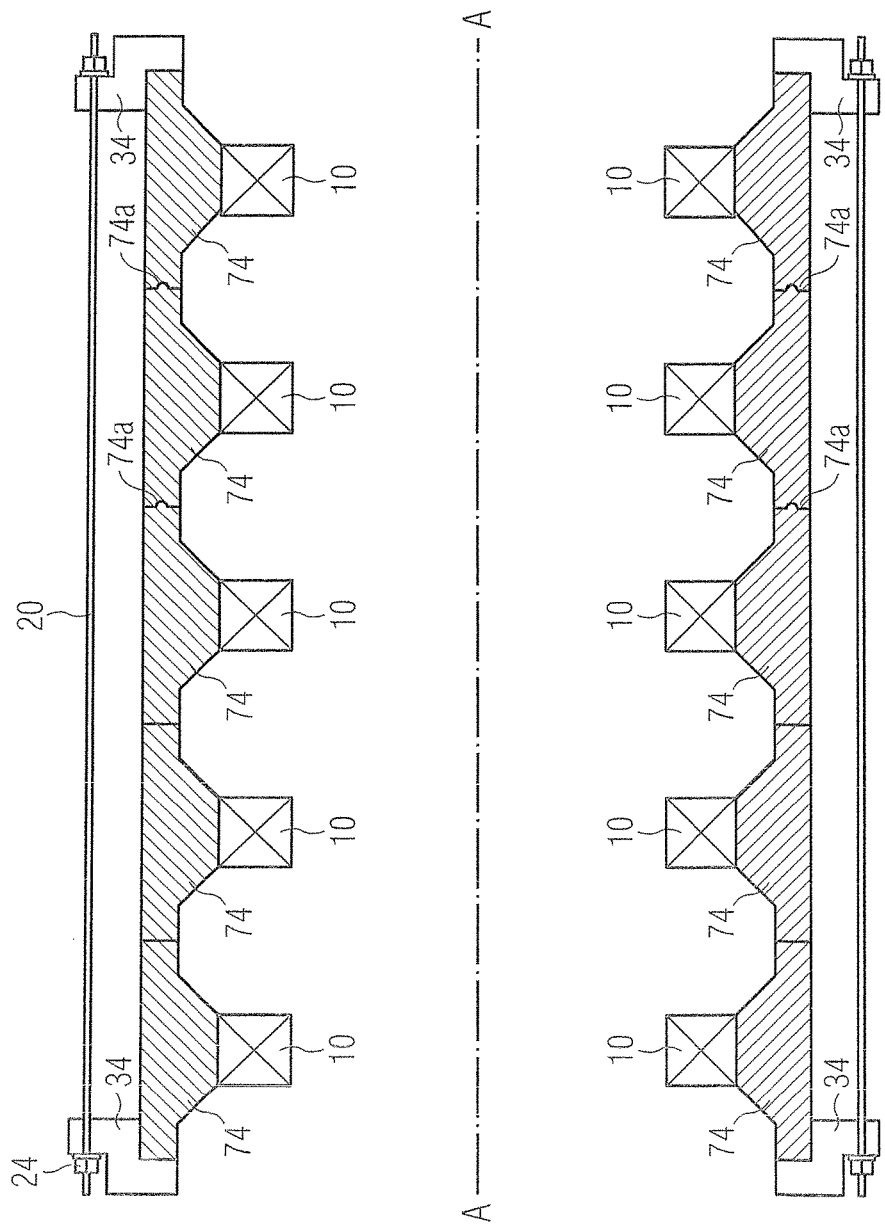

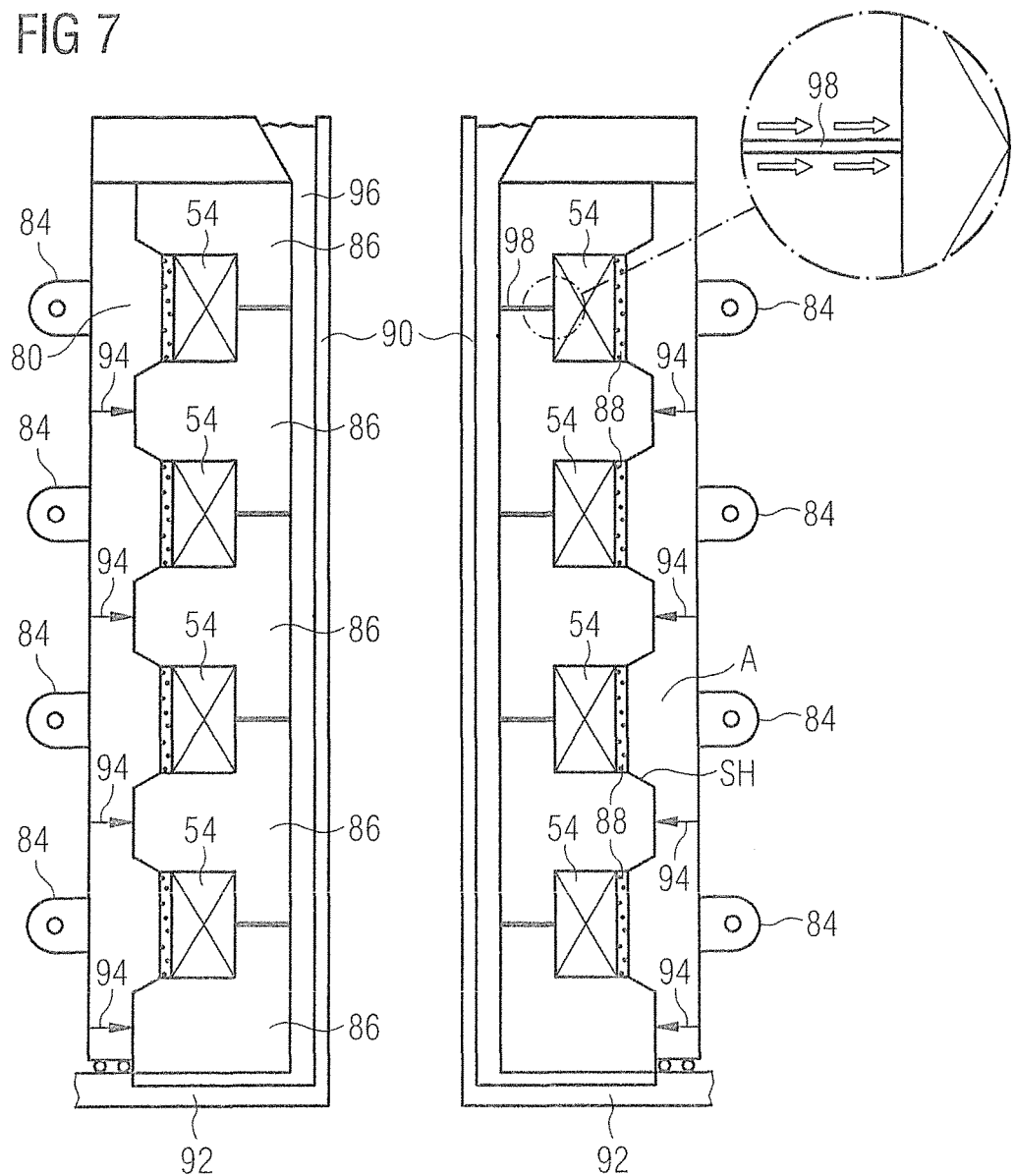
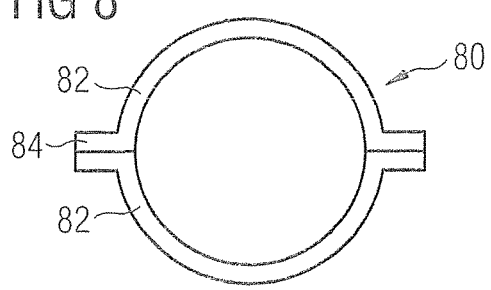

ADHESIVELY BONDED CYLINDRICAL MAGNETS COMPRISING ANNULAR COILS, AND METHOD OF MANUFACTURE THEREOF

RELATED APPLICATION

The present application is a divisional application of Ser. No. 13/239,658, filed on Sep. 22, 2011.

BACKGROUND OF THE INVENTION

Field of the Invention

The present invention relates to the manufacture of cylindrical electromagnets composed of a plurality of annular coils. The present invention finds particular relevance with respect to the manufacture of superconducting coils for magnetic resonance imaging (MRI) systems, but may be applied to other types of electromagnet, both superconducting and resistive.

Description of the Prior Art

Several methods for manufacturing cylindrical electromagnets have been used in the past. Conventionally, a cylindrical former is produced, for example of aluminum stainless steel or GRP, into which annular cavities of rectangular cross-section are formed. Coils of wire, for example superconducting wire, are then wound into these annular cavities. The resulting assembly may be impregnated with a thermosetting resin to retain the wire within the coils in position.

More recently, methods have been proposed in which coils are wound into cavities within a mold, with a supporting structure placed on the radially outer surface of the coils, and the resulting structure impregnated with thermosetting resin. The mold is then removed leaving the impregnated coils bonded to the supporting structure.

Co-pending United Kingdom patent application No. GB0912367.0 describes a solenoidal magnet arrangement in which the coils are bonded by their radially outer surfaces to a radially outer mechanical support structure.

United States Patent Application Publication No. 2007/0247263 describes another solenoidal magnet arrangement in which the coils are bonded by their radially outer surfaces to a radially outer mechanical support structure, and similar arrangements in which the supporting structure is placed in the mold first, with the coils being wound over the supporting structure.

A drawback of these methods is that the relative positions of the coils cannot be adjusted. While it may be theoretically possible to remedy deficiencies in the resultant magnetic field by adjustment of the relative positioning of certain coils, in practice this is not possible with coils structures which have been bonded to a support structure by resin impregnation.

Similarly, it has been found impractical to remove a single coil from such an assembly for repair or replacement, leading to scrapping of complete cylindrical magnet coil assemblies, even where only a single coil is defective.

Any new method of assembling annular coils must ensure that the coils are accurately positioned relative to one another, and that the coils will not move under the significant forces which they are subjected to in use.

Support structures for coils of superconducting solenoid magnets are described in U.S. Pat. Nos. 4,896,128 and 4,467,303. In each case, a coil is clamped onto a partial outer former by compressing the outer radial extremity of the coil between a step formation formed on the radially inner surface of the partial former and a clamp piece or clamp ring. In use, axial forces of several tonnes will act on the coils. As the coils are restrained only at their radially outer extremity, by compression at their axially outer extremities, severe stresses will build up within the coils. At least in U.S. Pat. No. 4,467,303, the coils are restrained by thermal shrinking of the outer support structure (e.g. column 4 lines 7-18). The resultant hoop, radial and axial stresses may cause damage to the structure of the coils, by cracking the impregnating material. Resulting movement of turns of the coils may result in a quench. The coils will be subjected to severe mechanical loading at the points of contact of the coil with the step formation and the clamp pieces or clamp ring. The present invention provides superconducting solenoidal magnet arrangements in which mechanical loading of the coils is not concentrated at localized points of contact. Rather, according to the present invention, each coil is bonded over its radially outer surface to an outer mechanical support structure. This avoids any local points of high mechanical stress, for example high shear stress within the coil structure such as caused by conventional coil supporting formations.

The mechanical load resulting from the axial forces on each coil is borne by a large surface area of the coil structure, where it is bonded to the radially outer mechanical support structure.

The term "solenoidal" is generally applied to describe cylindrical magnets made up of individual coils, although such cylindrical magnets may not be "solenoids" in the pure sense.

SUMMARY OF THE INVENTION

The present invention provides methods for manufacturing cylindrical magnets, and such magnets, that have annular coils bonded on their radially outer surfaces to a sectional radially outer mechanical support structure. In preferred embodiments, each annular coil is bonded to its own annular section of the radially outer mechanical support structure.

In an example method of the present invention, individual coils are adhesively bonded to corresponding sections of the support structure to form composite sections, each of these composite sections including a resin impregnated coil bonded to an annular section of the support structure.

The annular sections of the support structure may be of a material such as aluminum or a composite material such as glass fiber impregnated with thermosetting resin.

The individual annular sections of the support structure are then fixed together by suitable mechanical fasteners, such as tie-rods, spacers and fasteners, to form a complete cylindrical magnet coil structure.

Alternative embodiments of the method of the invention may involve attaching the coils to the annular sections using the impregnating resin, which may be performed during the resin impregnation step: in a single impregnation step; or in two impregnation steps, as will be discussed below.

In a certain embodiment, employing only a single impregnation step, coils or wire are wound into a mold tool journal. The winding may be performed separately for each coil, or multiple coils may be wound at once in a batch process.

The coils are then inserted into corresponding annular sections of the mechanical support structure. Arrangements, well known in themselves to those skilled in the art, are provided to ensure that each coil is concentric with the corresponding annular section of the support structure. At least the radially inner surface of the annular section is prepared for bonding to resin. This may simply be by ensuring that the surface is clean, but preferably involves some texturing of the surface. If the annular section is of aluminum, the preparation may be an anodizing step.

The resultant structure may be regarded as a mold, comprising the mold journal which carries the coil, the annular section of the support structure with the coil placed radially between the journal and the annular section, with appropriate tooling to ensure that the annular section and the coil are retained concentrically, and walls of the mold to complete the impregnation cavity.

The mold structure is inserted into a trough. A thermosetting resin is added in the conventional manner, to impregnate the coil and bond the coil to the annular section. As is conventional in itself, a filler material such as glass fiber cloth or glass beads may be placed in a gap between a radially outer surface of the coil and a radially inner surface of the annular section, if required. During the impregnation step, any such filler material will be impregnated and will form part of the resultant structure, with the coil bonded to the annular section.

The thermosetting resin is then allowed or caused to cure. The trough and journal are removed, leaving the coil and annular section adhesively bonded together by the thermosetting resin, with any filler material provided being embedded in a layer of thermosetting resin radially positioned between the coil and the annular section.

In another embodiment, which involves two impregnation steps, the coils initially are wound into a mold tool. The winding may be performed separately for each coil, or multiple coils may be wound at once in a batch process. Preferably, a filler layer such as glass fiber cloth or glass beads is placed over the radially outer surface of the coil within the mold.

Each coil is then impregnated within the corresponding mold by introduction of a thermosetting resin in the conventional manner. The thermosetting resin is then allowed or caused to cure, and the resulting impregnated coils are removed from the mold. The filler layer, if any, will have formed a resin-impregnated "crust" on the radially outer surface of the coil.

The outer surface of the crust of each coil is preferably then machined to a specified diameter.

The coils are then inserted into respective annular sections of the support structure. Arrangements, well known in themselves to those skilled in the art, are provided to ensure that each coil is concentric with the corresponding annular section of the support structure. Typically, a narrow annular gap is provided between the radially outer surface of the crust and the radially inner surface of the annular section. At least the radially inner surface of the annular section is prepared for bonding to resin. This may simply be by ensuring that the surface is clean, but preferably involves some texturing of the surface. If the annular section is of aluminum, the preparation may include an anodizing step.

Thermosetting resin is then introduced into the gap between coil crust and the annular section of the support structure. The thermosetting resin is then allowed or caused to cure. The journal is removed, leaving the coil and annular section adhesively bonded together by the thermosetting resin, with the crust layer radially positioned between the coil and the annular section.

Once a complete set of coil and annular section composites have been manufactured, they are mechanically combined together to form a complete cylindrical magnet coil structure, for example by using tie bars and spacers. The relative positions of the individual composites, and the coils they contain, are determined by either adjusting or setting the spacing of the tie bars, or the size of spacers used. For example, differently-sized spacers may be available, and/or shim pieces may be added to the spacers to adjust the alignment and spacing of the coils.

The present invention effectively provides axially divided coil former structures, which are mechanically assembled into a modular magnet coil structure. Such an arrangement enables the magnet coil structure to be disassembled, permitting the replacement or rework of a single coil within a magnet structure. This is not possible with arrangements which have all coils bonded onto a single former.

BRIEF DESCRIPTION OF THE DRAWINGS

FIG. 1E shows a spacer as also shown in FIG. 1A.

FIG. 2B shows a cut-away view of a composite section depicted in FIG. 2A.

FIG. 2C shows a cut-away view of a spacer as also shown in FIG. 2A.

FIG. 3E shows an example arrangement for adhesively bonding lugs to impregnated coils.

FIG. 3F shows a partial view of an assembly of coils such as illustrated in FIG. 3A.

FIG. 4 shows a cut-away view of a coil according to another embodiment of the present invention.

FIG. 6 illustrates an axial cross-section of a magnet according to an embodiment of the invention.

FIG. 7 shows an axial cross-section through another tooling arrangement useful for performing resin impregnation in a method of the present invention.

FIG. 8 illustrates an annular support section made up of two parts, as employed in certain embodiments of the invention.

DESCRIPTION OF THE PREFERRED EMBODIMENTS

Certain specific embodiments will now be described with reference to the accompanying drawings.

Molded Coils with Tie Bars

Figure 1A:
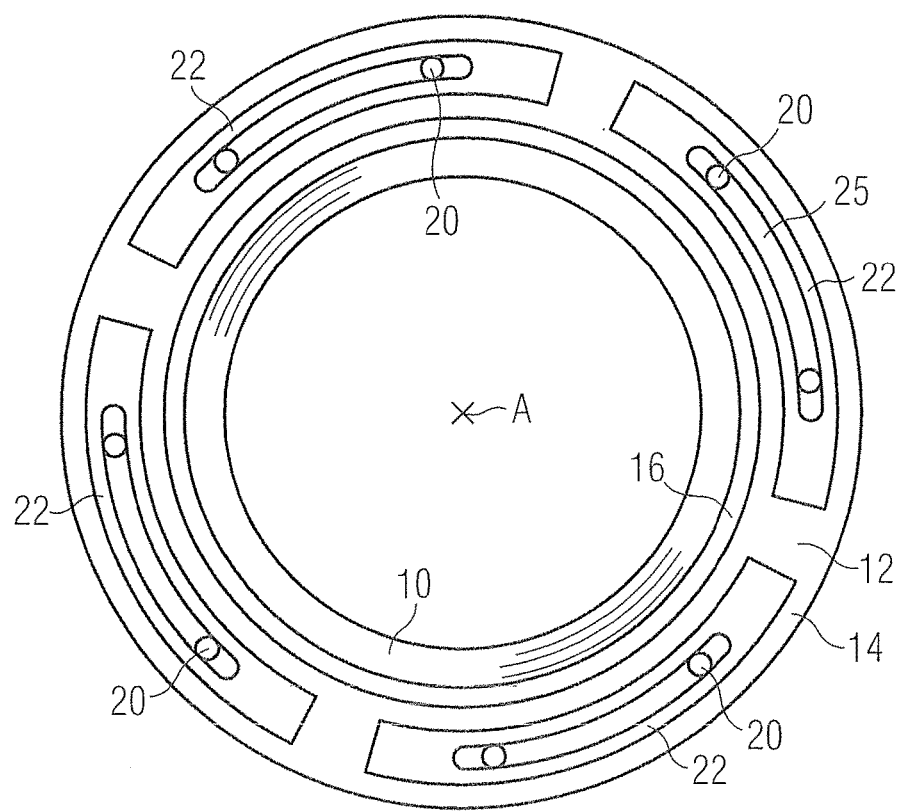
FIGS. 1A-1B show radial and axial cross-sections through a cylindrical magnet assembly according to an embodiment of the invention.
Figure 1B:
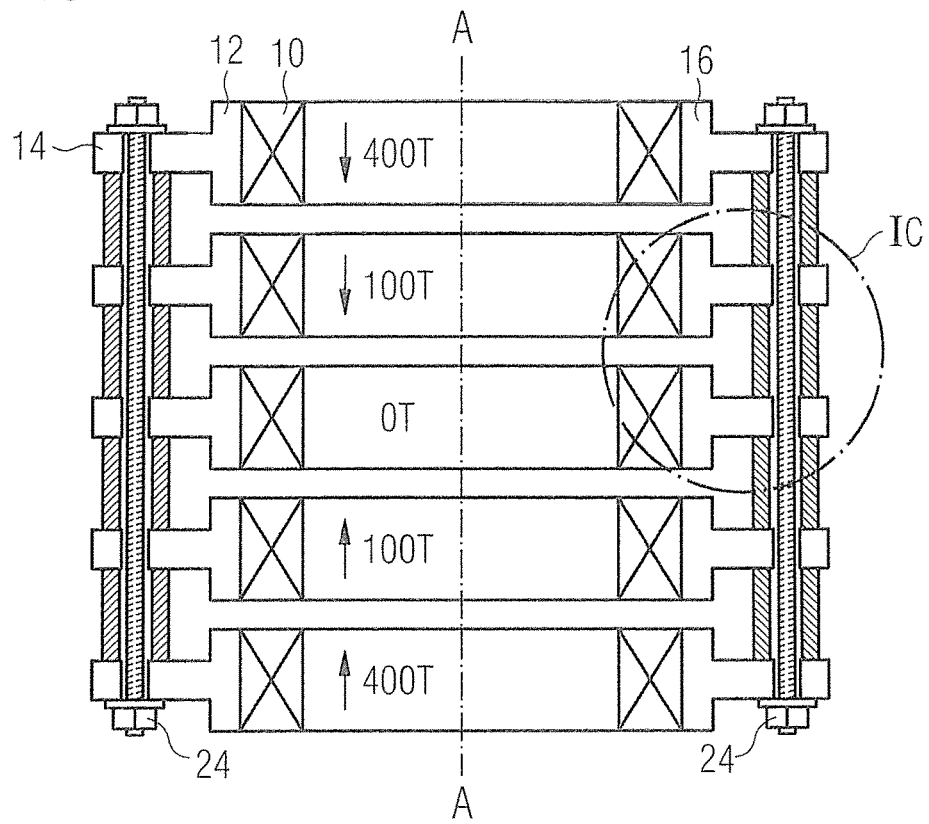
Figure 1C:
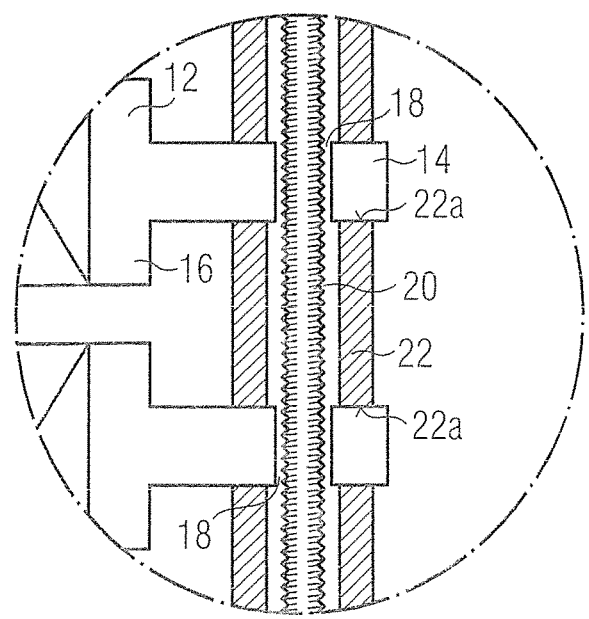
FIG. 1C shows an enlargement of a part of FIG. 1B.
Figure 1D:
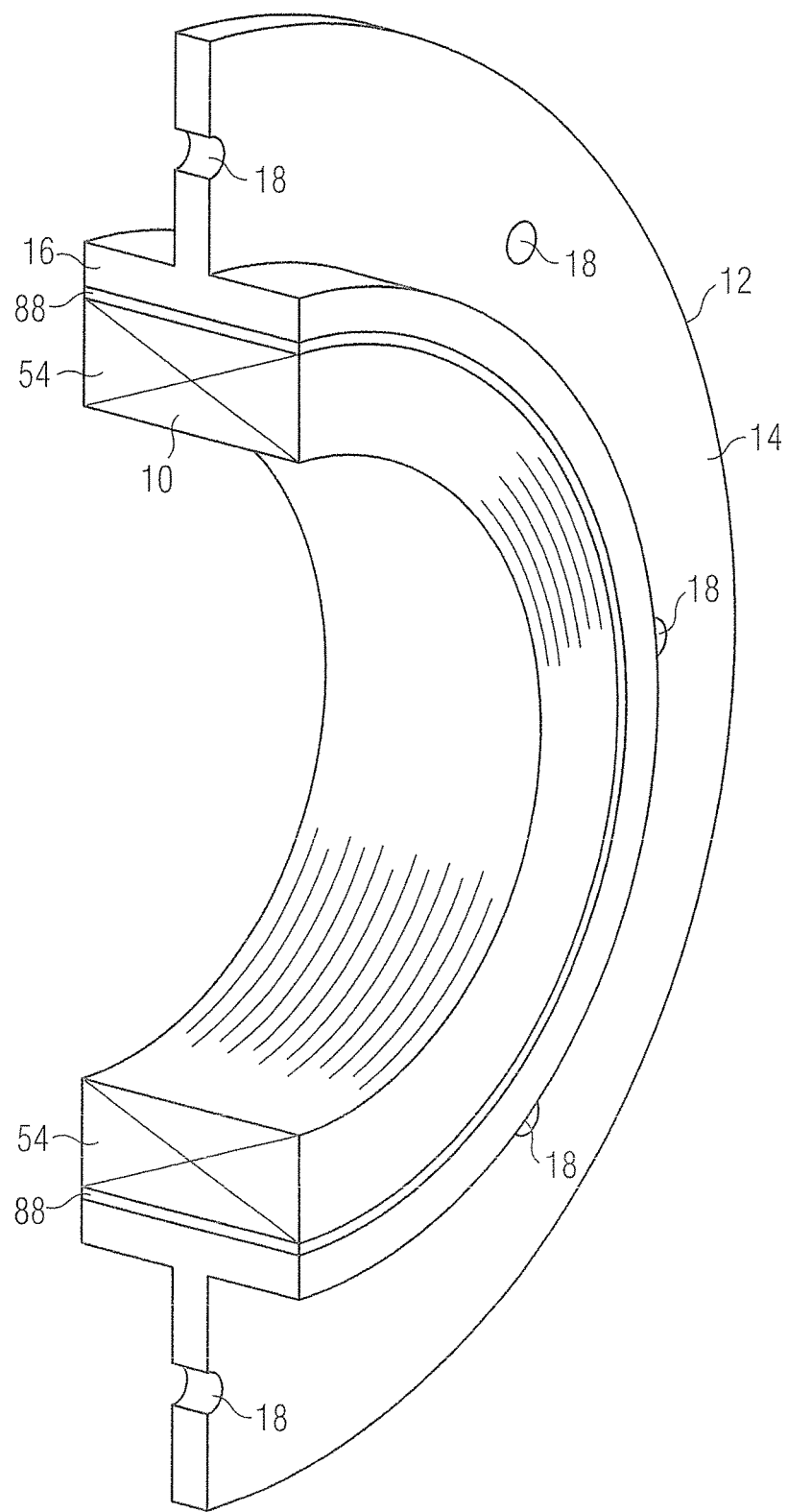
FIG. 1D shows a cut-away view of a composite section depicted in FIGS. 1A-1C.

FIGS. 1A-1B respectively show radial and axial cross-sections through a cylindrical magnet assembly according to an embodiment of the present invention. FIG. 1C shows an enlargement of the part of FIG. 1B identified as 1C. FIG. 1D shows a cut-away view of a composite section comprising a coil and an annular support section.

As discussed above, impregnated coils 10 are formed and adhered to annular sections 12 of a support structure, by a method such as described above. In this embodiment, each annular section comprises a radially directed flange 14 extending radially away from a cylindrical portion 16 which is bonded to the coil 10. Coil 10 itself may include a winding 54 and a crust layer formed of a resin-impregnated filler material 88.

Each radially directed flange 14 is provided with a number of through-holes 18. A number of tie-rods 20 are provided, extending through through-holes 18 at positions distributed around the radially directed flange 14. Spacers 22 are provided over the tie-rods, between adjacent flanges 14, to define and maintain a desired spacing between the coils 10. As shown in FIGS. 1A and 1E, these may be arcuate portions, having one or more elongate arcuate holes 25 for the tie-rods 20 to pass through. Alternatively, a single spacer 22 may be formed as a complete ring. An alternative of placing tubular spacers individually over the tie rods 20 is possible, but is not presently preferred as the increased surface area of arcuate spacers such as illustrated improves the rigidity of the structure as a whole. The spacers should be made of a non-magnetic material such as aluminum or resin-impregnated fiberglass cloth.

In an alternative embodiment, these spacers may be made of a magnetic material such as iron, provided that the shape, position and magnetization of the spacers is taken into account when designing the magnet, for example to create the required magnet field in an imaging region, or to act as shielding of the stray field for a magnet design that has no active shielding coils.

Retainers 24 are provided at each end of the tie-rod. For example, a nut and washer may be provided onto threaded ends of the tie-rod. The tie-rods 20 and the retainers 24 must be of sufficient quality and of an appropriate material, and provided in sufficient number, to restrain all forces which are experienced by the coils in use, and any forces which the coils may experience in transit. The tie rods and retaining means are preferably of a non-magnetic material. Stainless steel and aluminum components have been found to have acceptable properties for use in this application taking into consideration the thermal and mechanical properties required for the specific parts.

Assembly of the structure of FIGS. 1A-1C may proceed as follows. Each coil 10 is separately bonded onto a corresponding annular section 12 to form composite elements, one of which is partially illustrated in FIG. 1D. The composite elements are stacked over a jig which ensures correct alignment of each coil onto the axis A-A of the magnet assembly, as shown in FIG. 1B. The jig may comprise a suitable number of demountable mandrels mounted on an axis. Spacers 22 are accurately dimensioned, for example being ground flat to a close tolerance on each of their axial ends 22a. This ensures alignment and correct relative positioning of the coils when the structure is assembled.

Advantages provided by such an embodiment include the following. Direct manual or mechanical handling of the coils is not required—each coil is handled by the corresponding radially directed flange 14 of the annular section 12. The use of an alignment jig when stacking the coils and assembling the structure of FIGS. 1A-1C ensures that the coils are accurately aligned, and ensures consistent and repeatable alignment of coils within magnet assemblies. If one coil is damaged, during assembly or later on, it is a relatively simple task to release the fastening means 24, remove coils 10 and spacers 22 for access to the damaged coil, and to replace the damaged coil. The remaining coils and spacers may then be replaced, to re-construct the magnet assembly. The alignment jig should be used for alignment of coils during re-construction of the magnet coil assembly.

In an example 3 Tesla magnet of the type illustrated in FIGS. 1A-1E, the central coil will experience no net axial force. The outer coils, on the other hand, may each experience an axial force of 400 tons directed toward the axial center of the magnet. The intermediate coils may experience an axial force of 100 tons directed toward the axial center of the magnet. The mechanical support structure, and the structure of the coils themselves, must be capable of withstanding such forces over a long period of time.

Arrangements must be provided for electrical connections to be provided to and between the coils, but are not illustrated, for clarity. Ends of each coil winding 54 are kept accessible during the impregnation procedure by conventional methods.

If additional strengthening of the assembly is required, for example to counteract any bending of the tie bars due to the electromagnetic forces and the differential thermal contraction of the components, one option may be to attach additional rings. Such rings may provide improved mechanical strength to the ends of the structure, if required, and may also be positioned where required to counteract the effects of the electromagnetic forces and differential thermal contraction on the support structure. Such end-rings are preferably of non-magnetic material attached to axial ends of the magnet coil assembly by tie-rods 20 and retainers 24 as for an annular section 12.

Mold Coil Spacer Rings

For magnets with relatively high axial electromagnetic forces an alternative embodiment using spacer rings (FIG. 2A) in the place of tie bars (FIG. 1B) may be considered better suited for supporting the magnet coils. Advantages of using spacer rings include (1) the outer diameter of the support structure is reduced because the spacers are closer to the coils and (2) any bending moment acting on the support structure may be reduced.

Figure 2A:
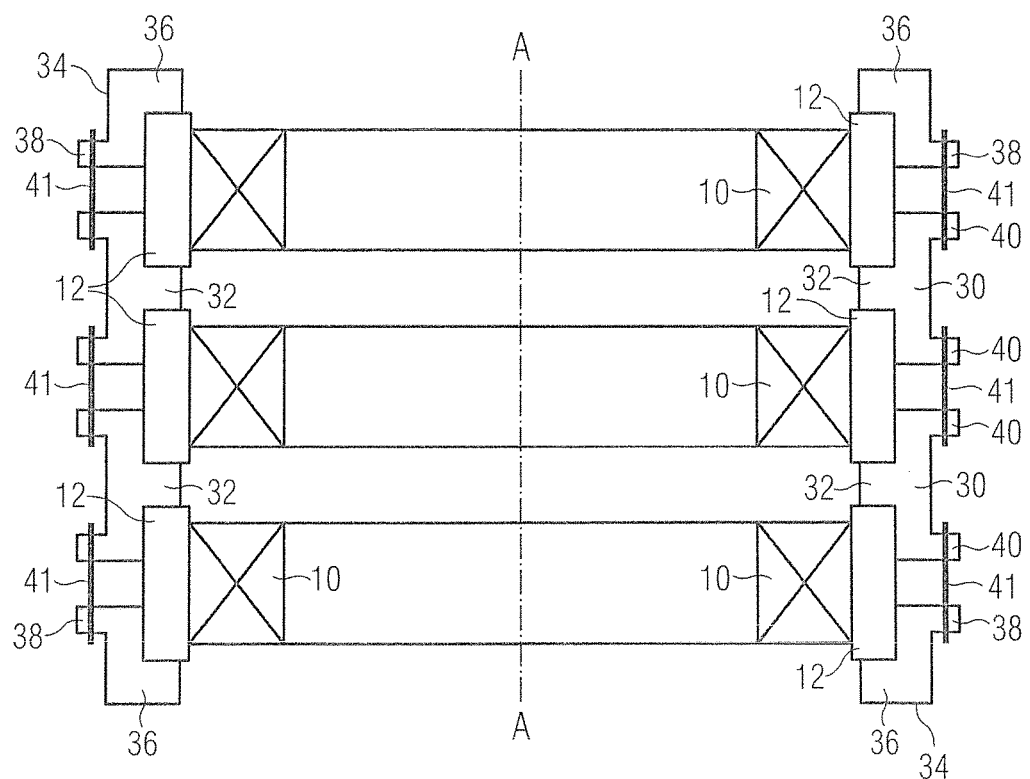
FIG. 2A shows an axial cross-section through a cylindrical magnet assembly according to another embodiment of the invention.

FIG. 2A shows an axial cross-section of an example magnet coil assembly of three coils, according to another embodiment of the invention. The structure is essentially symmetrical about axis A-A. Composite sections are provided, each comprising a coil 10 adhesively bonded on its radially outer surface to a radially inner surface of an annular support section 12. In this arrangement, no radial flanges 14 need be provided on the annular sections 12. A spacer ring 30 is provided between adjacent annular sections 12. Each spacer ring 30 has a radially-inwardly directed flange 32, which is accurately dimensioned to ensure correct alignment and spacing of coils 10 when positioned between adjacent annular sections 12.

FIG. 2B shows a cut-away view of a composite element, comprising a coil 10 and an annular section 12 as used in the embodiment of FIG. 2A. A crust of resin-impregnated filler material may be provided at a radial position between the winding and the annular section.

At axial ends of the structure, retaining rings 34 are provided. These each have a radially-inwardly directed flange 36, which may not need to be accurately dimensioned, but should be flat, so as to align correctly with the adjacent annular section. The retaining rings each have a radially-outwardly directed flange 38 which carries through-holes in a manner similar to that described with reference to FIGS. 1A-1C.

FIG. 2C shows a cut-away view of a spacer ring 30 as used in the embodiment of FIG. 2A. The retaining rings 30 each have at least one radially-outwardly directed flange 40, which carries through-holes 18 in a manner similar to that described with reference to FIGS. 1A-1C. As illustrated, in a preferred embodiment, each spacer ring 30 has two radially-outwardly directed flanges 40, one at each axial extremity of the spacer ring. The holes in the two flanges may or may not be aligned, as preferred for the mechanical assembly arrangement chosen.

Bolts, or tie-rods with end fasteners, or similar arrangements, are used to urge the retaining rings 34 towards one another, to compress the structure and to hold the coils 10 in their respective relative positions. The tie-rods 20 or bolts may extend the whole length of the magnet assembly, and be fastened only at their ends, as shown at 24 in FIG. 1B, so that the retaining rings 34 are directly linked together with tie-rods or bolts, with the tie-rods or bolts simply passing through the through-holes in the flanges 40 of the spacer rings.

Alternatively, some or all of the spacer rings 30 are provided with one or two radially-outwardly extending flanges 40, which each carry a number of through-holes 18. Bolts or tie-rods with end fasteners attach the retaining rings to the correspondingly adjacent spacer rings; and attach adjacent spacer rings together, as schematically illustrated at 41 in FIG. 2A.

Separation and alignment of coils 10 is determined by the correct positioning of each coil within the corresponding annular section 12, the correct dimensioning of the annular section 12 and the thickness of the radially-inwardly directed flanges 32.

The magnet coils are required to have a specific alignment with respect to each other to create the series magnetic field harmonics to create the overall shape of the homogeneous (imaging) region of the magnet field. Both the axial and concentric alignment of the coils must be considered during manufacture. If each coil 10 is axially and concentrically aligned to the corresponding annular section 12, to within a required tolerance, and the angular sections and spacers are dimensioned as required then the composite sections can be assembled with the coils positioned correctly. Any variance of these dimensions would require an alignment jig, which may be used either as a check of the coil alignment after assembly or to actively guide the correct alignment of the composite sections during the assembly.

Assembly of the structure of FIG. 2A may proceed as follows. An alignment jig is used to ensure correct axial alignment of the coils during assembly. For example, the alignment jig may comprise a number of demountable mandrels mounted on an axis aligned with the axis A-A of the magnet assembly. A first coil 10, adhesively mounted within its annular section 12, is placed on the alignment jig. A spacer ring 30 is then placed over the first coil. Assuming that the spacer ring is appropriately manufactured, it is not necessary for the alignment jig to control the positioning of the spacer ring. The spacer ring will lie on the annular section 12, but small tolerance in its radial alignment is unlikely to be detrimental to the performance of the magnet as a whole. A next coil 10 is then stacked on top of the spacer ring, and is aligned according to the alignment jig. This process continues until all coils and spacer rings have been stacked. If relevant, bolts or tie-rods are used to join spacer rings together, passing through holes in radially-outwardly extending flanges of the spacer rings. Retaining rings 34 are placed at axially outer ends of the assembly. One retaining ring 34 may be stacked prior to the first coil; alternatively, both retaining rings 34 may be placed in position after the coils and spacer rings have been positioned. Bolts or tie-rods are then positioned through through-holes in the radially outwardly-extending flanges 40 to retain the coils 10 in position, as described above. According to the embodiment in question, the bolts or tie-rods may extend between the retaining rings 34; or just between a spacer ring 30 and an adjacent spacer ring 30 or retaining ring 34. Radially-inwardly directed flanges 32 are accurately dimensioned, for example being ground to a close tolerance on each of their axially-directed faces. This ensures correct axial positioning of the coils when the structure is assembled. The annular sections 12 may all be of a same axial extent d, with different axial spacing of the coils provided, as desired, by appropriate thickness e of the radially-inwardly directed flanges 32 of the spacer rings 40.

Advantages provided by such an embodiment include the following. Direct manual or mechanical handling of the coils is not required—each coil is handled by the corresponding annular section 12. The use of an alignment jig when stacking the coils and assembling the structure of FIG. 2 ensures that the coils are accurately aligned, and ensures consistent and repeatable alignment of coils within magnet assemblies. If one coil is damaged, during assembly or later on, it is a relatively simple task to release the retainers 24; 41, remove a retaining ring 34, coils 10, and spacer rings 30 for access to the damaged coil, and to replace the damaged coil. The remaining coils and spacer rings and retaining ring may then be replaced, to re-construct the magnet assembly. The alignment jig should be used for alignment of coils 10 during re-construction of the magnet coil assembly.

Coils with Lugs Attached to Radially Outer Surface

Figure 3A:
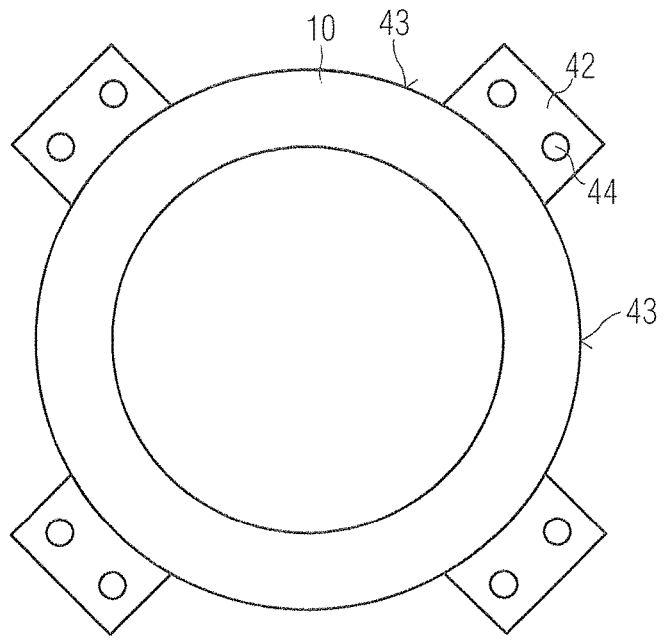
FIG. 3A shows an axial view of a coil with attached lugs for a cylindrical magnet assembly according to another embodiment of the invention.

FIG. 3A shows an axial view of a coil 10 with attached lugs 42, according to a further embodiment of the present invention. In this embodiment, no annular sections are bonded to the coils 10. Instead, separate lugs 42 having through-holes 44 are attached to the radially outer surface 43 of each coil, circumferentially spaced around the radially outer surface. A magnet assembly may then be assembled by passing retaining rods 20 through through-holes 44 in the lugs, and through spacers 22 such as shown and described with respect to FIGS. 1C and 1E.

Preferably, the outer surface of each winding 54 is protected by a crust layer 56 of glass cloth or glass beads, impregnated with the thermosetting resin used for impregnating the coils. This protects the wire of the windings from mechanical and electrical interaction with the lugs 42.

Figure 3B:
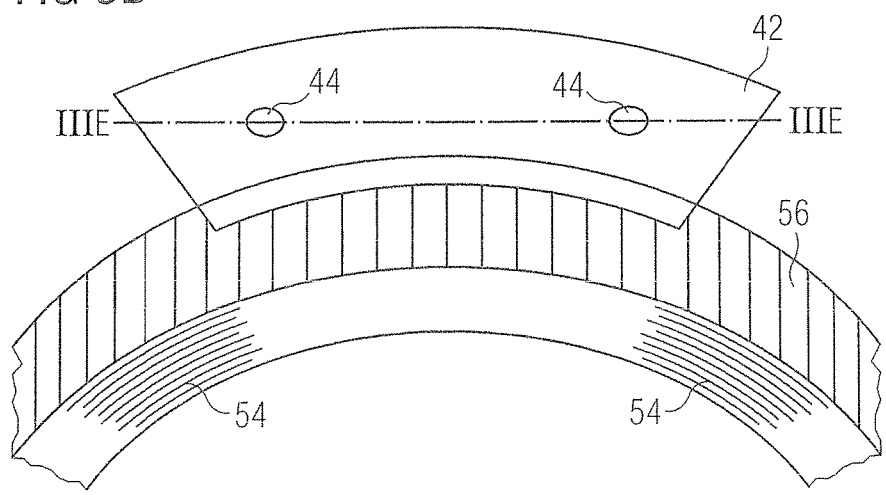
FIG. 3B is a cut-away view of a coil with a crust and lugs.

In an example method of manufacture, the lugs 42 could be positioned within the mold for resin impregnation, and bonded to the coil by thermosetting resin in the coil impregnation step. This has been found to provide a reliable, high-strength bond between the coil and the lugs. In FIG. 3B, a cut-away view is shown of a coil comprising winding 54, with a crust 56 of resin-impregnated glass beads covering the radially outer surface of the coil. As lugs 42 are housed within the mold used for impregnation, they can be partially embedded within the crust 56, which provides a secure adhesive bond between each lug and the coil.

Figure 3C:
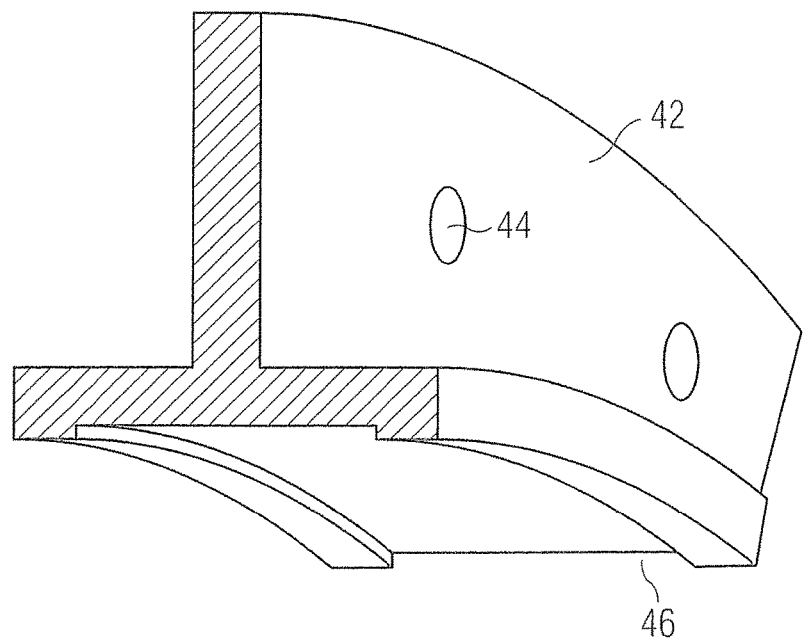
FIGS. 3C and 3D show views of lugs as may be used in coils such as shown in FIG. 3A.
Figure 3D:
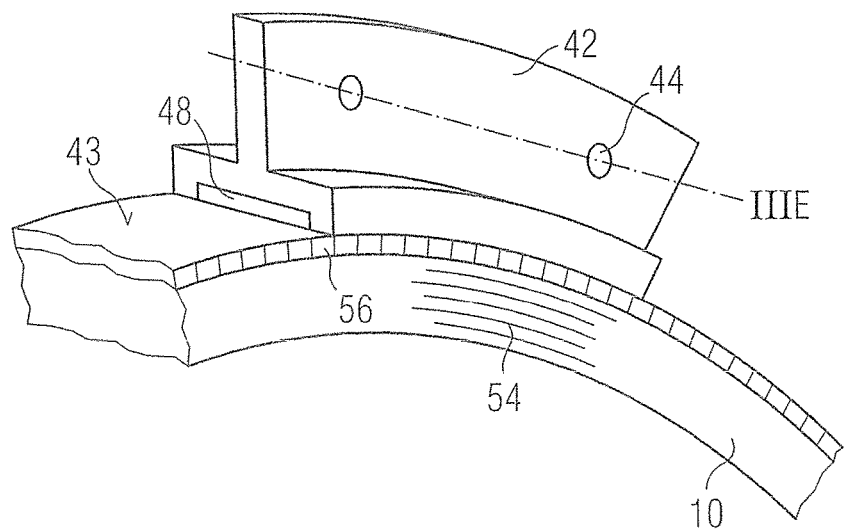

Alternatively, the coil may be impregnated in the conventional manner with thermosetting resin in a mold; the resin allowed or caused to cure; the coil removed from the mold, and lugs 42 then bonded to the radially outer surface of the coil using an adhesive. FIGS. 3C and 3D respectively show a perspective view of a suitable lug 42 with a cavity 46 useful for accommodating the adhesive 48 and a cutaway view of a lug 42 adhesively mounted to the radially outer surface of a coil 10, with an adhesive 48.

FIG. 3E schematically illustrates an example arrangement for adhesively bonding lugs 42 to coils 10. In this embodiment, the lug 42 extends axially the length of the coil 10. A cavity 46 is provided on the radially inner surface of the lug, to accommodate an adhesive 48 which is used to bond the lug 42 to the coil 10. A channel 50 is provided through the material of lug 42 into cavity 46, to enable the introduction of the adhesive into the cavity. The lug is placed on the radially outer surface 43 of the coil 10; adhesive is introduced through channel 50 into cavity 46, for example using a syringe. The adhesive is then allowed to cure, providing a secure adhesive bond between the lug 42 and the coil 10. Also illustrated in FIG. 3E is an extension piece 52, an optional part of the lug which extends onto an axial end of the coil 10. This allows simple manual axial alignment of the lug onto the coil by pressing the extension piece against the axial end face of the coil. The extension piece(s) may also assist in restraining the coil against the forces it encounters in use. Such forces would otherwise have to be borne only by the strength of the bond holding the lug to the coil.

In alternative embodiments, the lugs may have essentially rectangular radial cross-sections, having an axial length equal to the axial length of the coil.

FIG. 3F shows a partial view of an assembly of coils 10 according to this embodiment of the invention, taken in a plane through holes 44, such as shown at IIIE in FIGS. 3B and 3D. As shown, the coils 10 may be assembled together by passing bolts or tie-rods 20 with end fastenings 24 through the through-holes 44 in the lugs 42 and clamping the coils into position using the lugs and spacers 22. In these embodiments, it may not be necessary to use spacers 22 of large radial cross-section, such as that shown in FIG. 1E, as the spacers will bear against the lugs, which may themselves be built of mechanically strong material such as aluminum, with the interface with the coils 10 being through the larger interface surface of the lug on the coil. However, use of large radial cross-section spacers may advantageously improve the rigidity of the assembly as a whole.

Assembly of the arrangement of FIG. 3F is performed in a manner analogous to that described with reference to FIGS. 1A-1C. An alignment jig is used to ensure axial alignment of the coils, while the length of spacers 22 determines the relative axial positions of the coils. As with the arrangement of FIGS. 1A-1C, the spacers 22 are carefully dimensioned, for example by milling their axial ends.

Suitable materials for the lugs include aluminum and composite materials. It has been found that aluminum and various composite materials have acceptable surface properties for bonding to epoxy adhesives and are therefore expected to have acceptable properties for use in this application taking into consideration thermal matching and mechanical properties of the specific parts.

In an example, a coil impregnated with an epoxy resin may be bonded to an aluminum lug using an epoxy adhesive.

A crust of epoxy-impregnated cloth, or glass beads, or similar, may be provided over the radially outer surface of coils. These impregnated crusts of the coils may be machined to provide both axial and circumferential alignment for the lugs before bonding lugs onto the radially outer surface of the crust.

In alternative arrangements, lugs may be formed in-situ, e.g. by making suitably-shaped cavities in the impregnation mold, and filling them with glass fiber cloth or other filler material before performing the impregnation step. The resulting lugs are light, non-magnetic and a part of the coil structure itself, having a very high effective bond strength.

The arrangement of FIGS. 3A-3C has the same advantages as the arrangements of FIGS. 1A-1C and FIG. 2 in respect of each of dismantling for replacement of a defective coil.

Coils with Molded in Inserts in Crust

FIG. 4 shows a cut-away view of a coil according to another embodiment of the invention. In this embodiment, the mechanical retaining structure which is adhesively bonded to the radially outer surface of the coil 10 is a thickened crust 56 formed over the radially outer surface of the winding 54. Through-holes 60 are provided through the crust. These are preferably formed by including tubular inserts 62 within the crust during the impregnation step. Alternatively, the crust may be formed without through-holes; then, over-sized holes may be drilled through the crust, and the inserts 62 adhesively bonded into the crust. In other embodiments, solid metal inserts are provided, which are drilled with through-holes after the impregnation step is complete. In yet further variations, no inserts are provided, and through-holes are simply molded or drilled into the crust.

In a preferred embodiment, the wire 54 of the coil is wound onto a mold former, and placed in a mold for resin impregnation, the mold having sufficient space on the radially outer surface of the wire to accommodate the crust 56. A number of inserts are added into the mold at appropriate locations, and remaining space within the mold filled with glass beads, glass cloth or another suitable filler material. The mold is closed, and the wire and crust is then resin impregnated, resulting in the structure shown in FIG. 4. The through-holes 60 may be filled with a removable filling material such as wax or modeling clay to prevent the impregnating resin from blocking the through-holes. Features may be provided in the mold to ensure that the inserts 62 are placed, and remain, in their correct positions. In addition, or alternatively, a web (not illustrated) may be provided to ensure that the inserts 62 are correctly positioned relative to one another and relative to the winding 54.

Such coil structures may be assembled together into a complete magnet assembly using tie bars or bolts with spacers, as explained with reference to other embodiments. Preferably, spacers with large axial surface area, such as shown in FIG. 1E, should be used as these will spread the load applied to the crust and provide improved rigidity to the magnet structure as a whole.

Batch Process Tool

Figure 5:
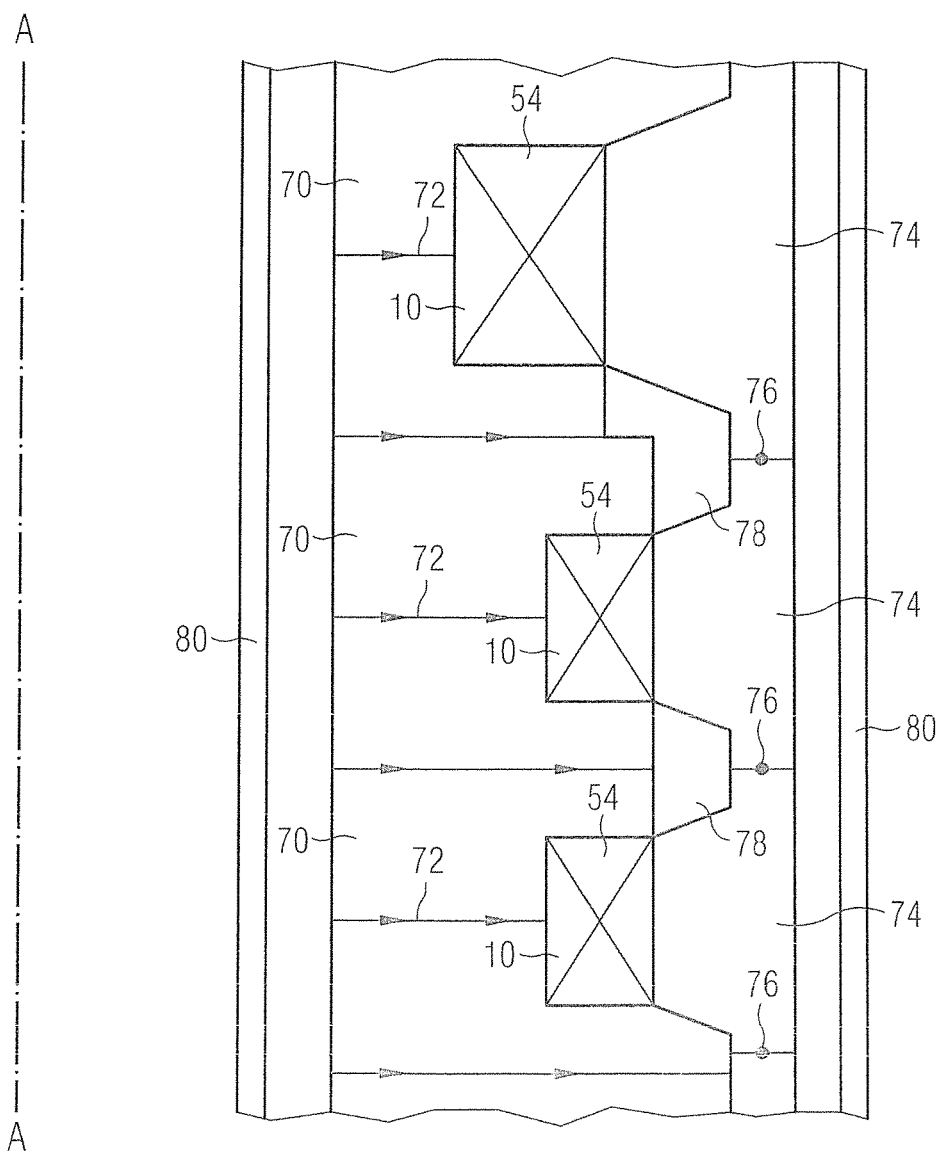
FIG. 5 shows a part-axial cross-section through a tooling arrangement useful for performing resin impregnation in a method of the present invention.

FIG. 5 shows a part-axial cross section through a tooling arrangement which may be used in a method according to the present invention to perform resin impregnation and bonding of multiple coils in a single operation. As shown, multiple windings 54 are would onto respective mold journals 70. As illustrated, these may be axially divided multi-part journals for each coil, allowing each journal to be removed from its corresponding coil once the impregnation step is complete. An advantage in using axially divided multi-part journals 70 is that it is simple to provide runners 72 between the parts of the journals, allowing impregnating resin to access the coils through the journal.

The outer parts 74 of the mold may be the annular support elements described above, which are mechanically joined to coils 10 in the finished structure. In the illustrated arrangement, the outer parts 74 each extend axially beyond the winding 54 of each respective coil, and so may be used in an assembly such as illustrated in FIGS. 2A-2C. Alternatively, by appropriately selecting the axial extent of each annular support element 74, a magnet assembly of the present invention may be assembled without requiring spacers between the annular support elements. FIG. 6 shows such an embodiment, and is described below.

Seals 76, such as elastomer rings, are provided between the annular support elements 74 to prevent resin from leaking between the support elements. The journals 70, windings 54 and annular support elements 74 are surrounded by a resin trough 80, and resin introduced under vacuum through the runners 72 to impregnate the windings 54 and bond them to the annular support elements 74. Alternatively, the annular support elements 74, linked by seals, may function as the outer section of the trough sealed to a removable inner trough section, thus reducing the amount of excess resin. Preferably, an interface layer such as wound glass fiber cloth is provided between the winding and the annular support element 74. Voids 78 facilitate the flow of resin. The surfaces of the annular support elements exposed to the voids are preferably coated with a release material such as PTFE polytetrafluoroethylene to facilitate removal of excess resin once the impregnation step is complete. The surface of the annular support structure which interfaces with the winding may be prepared in a manner which improves bonding by the resin: for example, sandblasting, gritblasting or anodizing, if of aluminum.

Once the resin has been introduced, and caused or allowed to cure, the tooling is dismantled, and excess resin removed.

FIG. 6 illustrates an axial cross-section of a magnet according to an embodiment of the invention, in which the coils may be prepared as described with reference to FIG. 5. A number of coils 10 on annular support sections 74 are aligned co-axially about magnet axis A-A, preferably being stacked using a jig as described above. Retaining rings 34, as described with reference to FIG. 2A, are placed at each end of the stack, and tie-rods 20 pass through respective holes in the retaining rings 34, and are fastened in place by fasteners 24 which apply tension to tie rods 20 to compress the annular support sections 74 and retain them in position. In this embodiment, there is no need to provide separate spacers of any sort between the annular support sections, as the axial extent of each support section is determined to provide the correct coil spacing once the magnet is assembled. It may be preferred to provide interlocking features on faces of the annular support sections, such as a raised ridge around one axial end surface of each support section, and a corresponding trough in the other axial end surface of each support section—illustrated for example at 74a in FIG. 6. If these ridges and troughs are accurately machined, it may be possible to assemble the magnet without use of the jig, simply by stacking the coils on top of one another, ensuring that the ridges and troughs in the annular section are correctly aligned. In an alternative arrangement, the tie-rods may pass through holes in the support sections positioned on the radially outer surface of the support sections, for example in lugs formed on the radially outer surfaces of the support sections.

The Batch Process Tool arrangement of FIGS. 5 and 6, and the associated methods described above, may be used for winding and impregnating a complete magnet, with the coil positions defined by the winding journals, and bonded onto the support structure. During the process, the support structure including journals 70 is then disassembled. The journals and any other parts of the support structure are removed from the supported coils, and the coils 10 bonded to their respective supports 74 are reassembled, typically in the same sequence as they were when impregnated, to form a magnet structure with the correct coil positions.

Segmented Outer Support Sections

FIG. 7 illustrates an axial cross-section through an impregnation tool arrangement which resembles that of FIG. 5. In this arrangement, the annular support sections 80 are made up of at least two, and preferably at least three, arcuate parts. FIG. 8 generally illustrates an annular support section 80 made up of two arcuate parts 82. Each arcuate part is provided with features 84 enabling them to be joined together to form complete annular support sections 80. In the example shown in FIG. 7, those features 84 may be lugs, each having a through-hole enabling bolts to be passed through adjacent lugs of adjacent sections to form a support section 80. Such an arrangement is advantageous in that, once the coils 10 have been assembled into a magnet structure, the lugs may be used to attach the magnet to a support structure, or to attach outer coils to the magnet.

In the arrangement shown in FIG. 7, a number of axially divided journal pieces 86 are retained together, for example by clamping. A number of windings 54 are wound into journal cavities. Layers of filler material, such as glass fiber cloth 88 may be wound over the windings 54. The annular support sections 80 are then assembled around the windings 54, over the filler material 88, if present, by joining arcuate parts 82 together. The resulting assembly is placed within a resin trough. In the illustrated example, the "trough" in fact only has an inner wall 90 and a base 92, the outer wall being effectively provided by the annular support sections 80. Seals 94, such as elastomer rings, are preferably provided between the annular support sections 80, and between the trough base 92 and the lawer annular support section 80. Resin 96 is then introduced, under vacuum, into the trough, and permeates resin flow paths 98 between the journal pieces, as shown in the enlarged extract in FIG. 7. The resin impregnates the windings 54, the filler material 88, if any, and causes adhesive bonding of the resulting coil to the outer support section. The resin is caused or allowed to cure. Surfaces of the journal pieces 86 and surfaces of the annular support section which are not to be bonded to the coil are preferably coated with a release material such as PTFE polytetrafluoroethylene to facilitate disassembly of the tooling once the impregnation step is complete.

This apparatus and the associated method described above provides winding and impregnating of a set of identical coils, which may subsequently be matched with different coils, which have been manufactured in a similar manner, to form a final magnet assembly.

Simplified Winding and Impregnation Tooling

Figure 9:
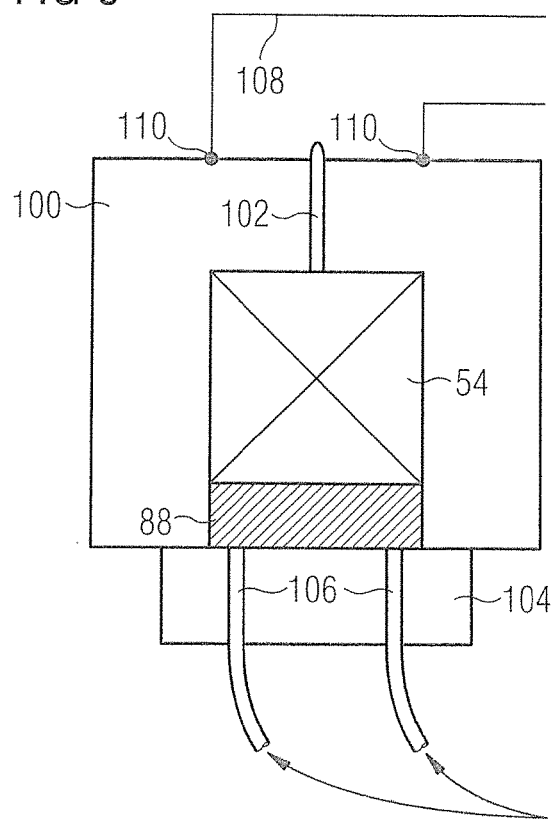
FIG. 9 shows a partial radial cross-section through a tooling arrangement useful for performing resin impregnation in a method of the present invention.

FIG. 9 shows a partial radial cross-section through simplified tooling which may be used in a method of the present invention for preparing coils for assembly into a magnet structure of the present invention. In this example, a single journal is provided, made up of two axially divided parts 100, having a runner 102 of small cross-sectional area defined between them.

An annular section 104 having runners 106 defined in it is placed over a winding 54 wound into the journal, and any filler material 88 which may be present. A thermosetting resin is introduced through runners 106 to impregnate the filler material 88 and the winding 54. Air and excess thermosetting resin may exit the journal through the runner 102. Alternatively, the resin impregnation may be carried out under vacuum. A tool 108 may be temporarily placed over runner 102 to collect excess resin. The tool may be sealed to the journal with seal 110. In the illustrated arrangement, hoses are attached to runners 106 to carry the resin to the coil. Alternatively, resin impregnation may be performed using a resin trough, as is conventional. The impregnating resin is caused, or allowed, to cure. The journal pieces are then removed from the coil structure to leave the coil 10 comprising impregnated winding 54 adhesively bonded to the annular support section 104.

Such a simplified tooling arrangement may be used to form coil assemblies according to any of the described embodiments of the present invention. Embodiments such as shown in FIG. 4, where the annular mounting section is composed of impregnated filler material may be formed by a similar method, in which the annular part 104 of the mold is coated with a release coating, to enable removal of the coil from the annular part.

Spindler and Hoyer Kit

Figure 11:
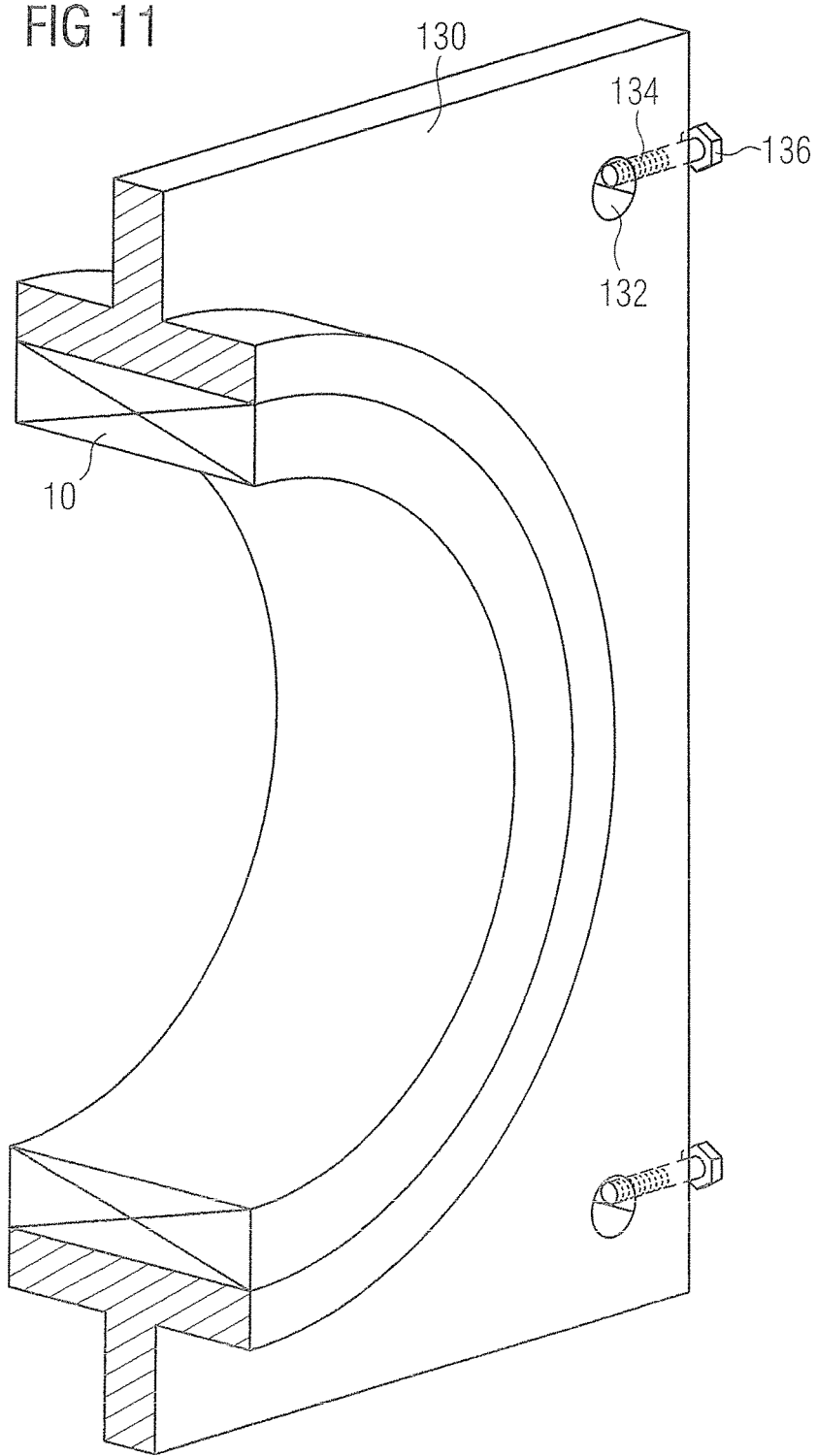
FIG. 11 illustrates a coil and square support section.

FIG. 11 illustrates a coil 10 mounted upon a square support section 130. This assembly may be prepared by any of the methods previously described, For example by manufacturing a resin-impregnated coil by any conventional method, aligning it with the square support section 130 and bonding the coil to the support section, for example by a second resin impregnation step, possibly interposing a filler layer such as glass cloth or glass beads between the radially outer surface of the coil and the adjacent surface of the support section 130 before the second impregnation step. Alternatively, the square support section 130 may be used as a part of the mold during the first impregnation step. In that case, the adjacent surface of the support section 130 is not coated with a release agent, but on the contrary may be roughened by sandblasting, gritblasting or anodizing as appropriate to ensure secure bonding of the coil to the support section.

Through-holes 132 may be provided through the support section as illustrated. For a square support section as illustrated, it may be particularly convenient to provide four through-holes 132, one near each corner of the square support section; or a multiple of four through-holes, evenly distributed about the four corners.

Figure 12:
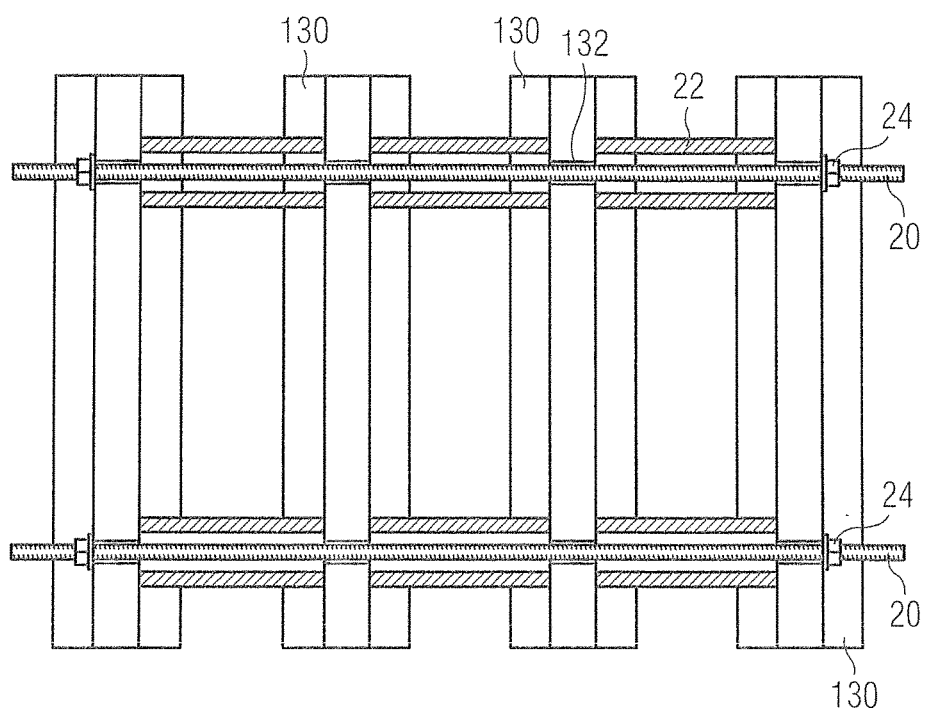
FIG. 12 illustrates an arrangement, similar to that shown in FIG. 3F, which may be used to assemble supported coils such as that illustrated in FIG. 11 into a magnet assembly.

FIG. 12 illustrates an arrangement, similar to that shown in FIG. 3F, which may be used to assemble supported coils such as that illustrated in FIG. 11 into a magnet assembly. As illustrated, and as in the example of FIG. 3F, hollow spacers 22 may be provided, over tie-rods 20, to ensure correct spacing of the coils 10 on the support sections 130. Alternatively, tie rods 20 may be threaded along their length, for example being aluminum or stainless steel studding, and nuts and washers 24 may be provided on both sides of each support section 130 to hold each coil in place. Such an arrangement has the advantage that the positions of the coils 10 may easily be adjusted during assembly.

Figure 13:
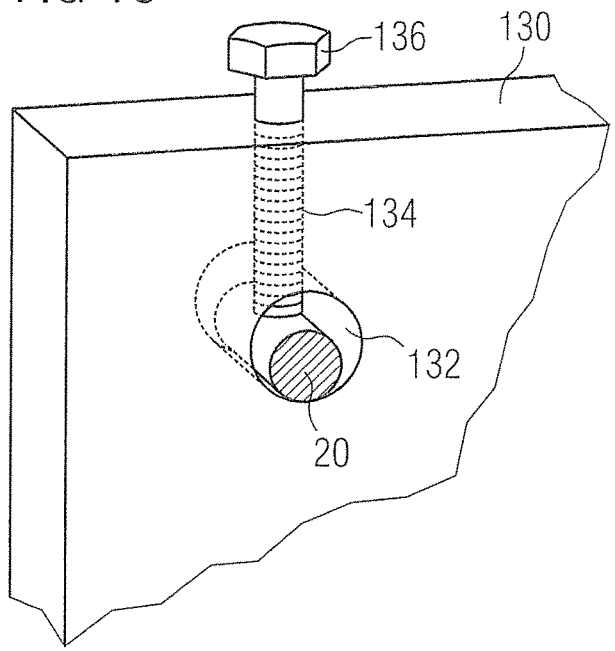
FIG. 13 shows an adjustable coil retention arrangement which may be used in assembling supported coils such as that illustrated in FIG. 11 into a magnet assembly.

FIG. 13 shows another adjustable coil retention arrangement which may be used in assembling supported coils such as that illustrated in FIG. 11 into a magnet assembly. Tie rods 20 may be threaded or unthreaded in this arrangement. At each through-hole 132, a threaded hole 134 is provided, to intercept through-hole 132 approximately at right angles. Screws 136 are provided in the threaded holes. Once a coil is aligned in position, for example using a jig as described previously, the screws 136 are tightened onto the tie-rods to hold the coil in position. Spacers 22 would not then be required. The ends of the screws 134 may be tapered to provide more secure retention of the coils in position on the tie rods.

Similar arrangements have been used, with twelve aluminum M12 bolts each having a tensile load of about 1 Tonne have been found sufficient to restrain an axial force on the end coils of a 0.5 Tesla magnet of the order of 10 Tonnes. For high field magnet designs, the number and size of tie bars may be increased to provide the required structural strength.

Figure 14:
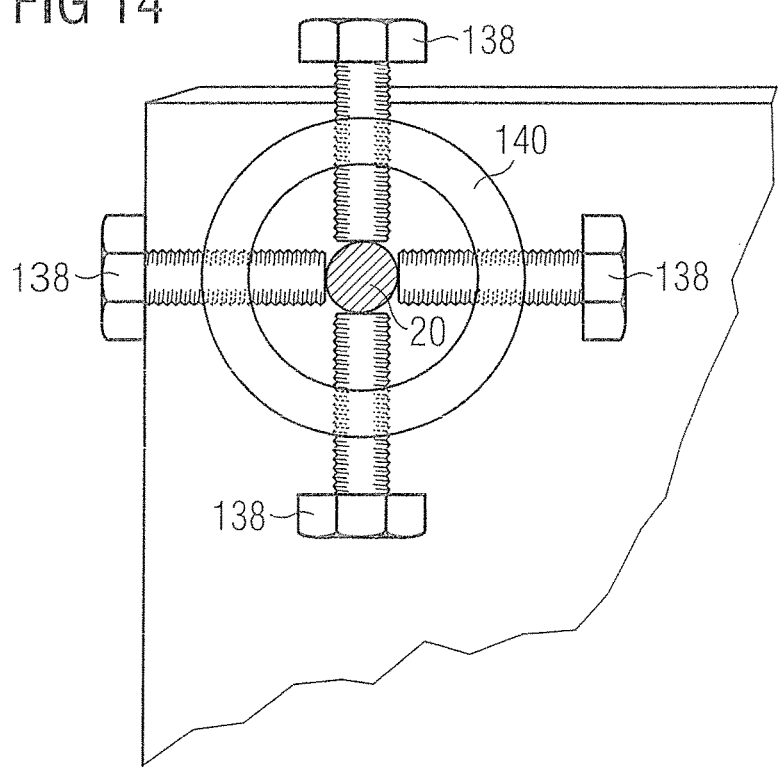
FIG. 14 shows an arrangement useful for adjusting coil concentricity in certain embodiments of the invention.

In an improvement of this arrangement, adjustment of the coil concentricity may be enabled by using three or more bolts 138 at each pinch point, for example as illustrated in FIG. 14, where four bolts 138 are provided, perpendicular to one another and to the tie bar, and provided through threaded holes in a support ring 140 provided for the purpose on at least one side of the support section 130. Such embodiments make use of the tie bars without the need for spacers 22. In an alternative embodiment the support sections 130 may be extended out radially to support an active shielding coil (not illustrated).

Adjuster for Coil Alignment

Figure 10:
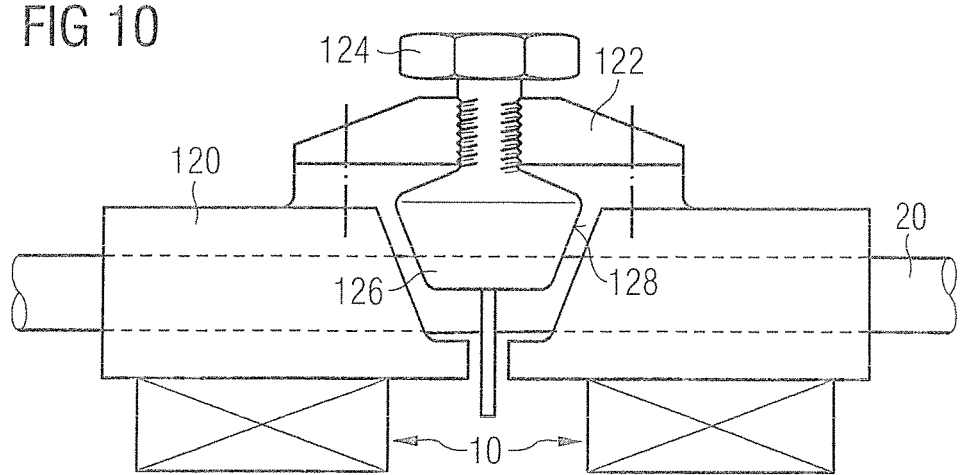
FIG. 10 shows an example of a mechanical coil alignment adjuster.

The above-described assembly methods describe the use of a jig to ensure correct alignment and assembly of the coils. It may be found necessary to provide a mechanical adjustment between coils, while the assembly is on the jig or after it has been removed from the jig. For example, an electric current can be passed through the metal cross-section in the wire and the resulting magnetic field measured. The axial coil positions of the magnet can then be optimized for the desired magnetic field harmonics. FIG. 10 illustrates an example of a mechanical coil alignment adjuster as may be used in some embodiments of the present invention. It may be regarded as an adjustable spacer. Between two annular support sections 120, a retainer 122 carries a conical rotary adjuster 124. A radially inner end of the adjuster has a conical surface 128, which bears upon correspondingly tapered surfaces of the adjacent annular support sections 120. The adjuster has a threaded shaft which passes through a threaded hole in the retainer 122. The adjuster preferably has a head configured for simple operation with a hand tool: for example, a hexagonal head for turning with a spanner; a recessed hexagon for turning with an Allen key, a recess to receive a screwdriver and so on. At least three adjusters should be provided around the circumference of the support sections, at any given axial position.

The coil alignment adjuster may be operated as follows. With the tie rods 20 under little or no tension, the head of each adjuster may be turned to adjust the relative alignment of coils. Moving the adjuster radially inward will push the support sections and the attached coils further apart at that circumferential position, while moving the adjuster radially outward will allow the support sections and the attached coils to move closer together at that circumferential position.

In an example embodiment, the conical surface of the adjuster has an included angle of 4°, allowing precise adjustment of coil alignment. The retainer 122 may be a complete ring, placed in position as the coils are assembled together. Alternatively, individual retainer bosses may be positioned at required positions, preferably equally spaced, around the circumference of the annular retainer sections at a particular axial position. The bosses may be attached to the annular retainer sections 120 by a suitable arrangement such as bolts in threaded holes in the annular retainer sections.

In a development of this idea, the conical rotary adjuster 124 may be replaced by a tapered bar, which is radially pressed into the tapered gap between annular support sections, or radially released from the tapered gap as desired to achieve correct coil positioning. The use of a tapered bar will have the advantage of providing a greater contact surface area with the annular support section, reducing mechanical point loading on the annular support sections 120. The tapered bar may be positioned by an adjustable strap running circumferentially around the retaining sections and the bar, or by threaded adjusters similar to that illustrated in FIG. 10, which bear on a radially outer surface of the bar.

While the present invention has been described with reference to a limited number of specific embodiments, it will be apparent to those skilled in the art that numerous variations and amendments are possible, within the scope of the invention as defined by the appended claims.

For example, while the present invention has been specifically described with reference to cylindrical superconducting magnets for MRI systems, it may be applied to cylindrical electromagnets for any purpose, whether they are superconducting or resistive.

A full scale prototype magnet has been manufactured and tested with end coils that have been bonded to the support structure in a two stage impregnation process and proved operational at 3 Tesla.

Although modifications and changes may be suggested by those skilled in the art, it is the intention of the inventors to embody within the patent warranted hereon all changes and modifications as reasonably and properly come within the scope of their contribution to the art.

We claim as our invention:

1. A solenoidal magnet assembly comprising:
   a plurality of concentrically aligned coils that constitute all coils of the magnet assembly, each coil comprising a winding impregnated with a resin, and said coils proceeding successively in an axial direction;
   each coil being adhesively bonded by a radially outer surface of the resin to a corresponding annular support section;
   at least one of the annular support sections comprising a cylindrical section with a radially directed flange extending radially away from the cylindrical portion, the radially directed flange having holes therein, through which tie-rods or bolts pass, the tie-rods or bolts holding the annular support sections in compression;
   a mechanical restraint acting on the annular support sections, that holds the annular support sections in fixed relative positions to form the magnet assembly; and
   spacers positioned between the annular support sections, wherein a fixed axial spacing between successive coils is defined by an axial length of the annular support sections and of the intervening spacers.

2. A solenoidal magnet assembly according to claim 1 further comprising at least one adjustable spacer positioned between adjacent annular support sections, thereby enabling adjustment of the relative positions of the associated coils.

3. A solenoidal magnet assembly according to claim 1, wherein at least one of the spacers is tubular.

4. A solenoidal magnet assembly according to claim 1, wherein at least one of the spacers is arcuate in radial cross-section.

5. A solenoidal magnet assembly according to claim 1, wherein at least one of the spacers is annular in radial cross-section.

6. A solenoidal magnet assembly according to claim 1, wherein at least one of the annular support sections is composed of at least two arcuate sections mechanically linked together.

7. A solenoidal magnet assembly according to claim 1, wherein at least one of the annular support sections is a complete annular piece.

8. A solenoidal magnet assembly comprising:
   a plurality of concentrically aligned coils that constitute all coils of the magnet assembly, each coil comprising a winding impregnated with a resin, and said coils proceeding successively in an axial direction;
   each coil being adhesively bonded by a radially outer surface of the resin to a corresponding annular support section;
   tie-rods that extend through corresponding holes in the annular support sections, and fasteners that hold the tie rods in tension, thereby retaining the annular support sections in fixed relative positions;
   a mechanical restraint acting on the annular support sections, that holds the annular support sections in fixed relative positions to form the magnet assembly; and
   spacers positioned between the annular support sections, wherein a fixed axial spacing between successive coils is defined by an axial length of the annular support sections and of the intervening spacers.

9. A solenoidal magnet assembly according to claim 8, wherein at least one of the spacers is arcuate in radial cross-section, and at least two tie-rods pass through the spacer.

10. A solenoidal magnet assembly according to claim 9, wherein the annular spacer comprises a radially-inwardly directed flange, dimensioned to ensure correct alignment and spacing of adjacent coils when positioned between adjacent annular support sections.

11. A solenoidal magnet assembly according to claim 8, wherein at least one of the spacers is annular in radial cross-section, and at least two tie-rods pass through the spacer.

* * * * *